(12) United States Patent
Cao et al.

(10) Patent No.: US 10,546,884 B2
(45) Date of Patent: Jan. 28, 2020

(54) ARRAY SUBSTRATE AND MANUFACTURING METHOD THEREOF, AND DISPLAY DEVICE

(71) Applicants: BOE Technology Group Co., Ltd., Beijing (CN); Hefei Xinsheng Optoelectronics Technology Co., Ltd., Hefei (CN)

(72) Inventors: Ke Cao, Beijing (CN); Chengshao Yang, Beijing (CN); Jun Ma, Beijing (CN)

(73) Assignees: BOE Technology Group Co., Ltd., Beijing (CN); Hefei Xinsheng Optoelectronics Technology Co., Ltd., Hefei, Anhui (CN)

( * ) Notice: Subject to any disclaimer, the term of this patent is extended or adjusted under 35 U.S.C. 154(b) by 0 days.

(21) Appl. No.: 16/065,942

(22) PCT Filed: Nov. 8, 2017

(86) PCT No.: PCT/CN2017/109897
§ 371 (c)(1),
(2) Date: Jun. 25, 2018

(87) PCT Pub. No.: WO2018/099250
PCT Pub. Date: Jun. 7, 2018

(65) Prior Publication Data
US 2019/0013338 A1    Jan. 10, 2019

(30) Foreign Application Priority Data
Dec. 2, 2016    (CN) .......................... 2016 1 1094764

(51) Int. Cl.
*H01L 27/12* (2006.01)
*H01L 29/66* (2006.01)
(Continued)

(52) U.S. Cl.
CPC ...... *H01L 27/1248* (2013.01); *H01L 27/1262* (2013.01); *H01L 21/31111* (2013.01);
(Continued)

(58) Field of Classification Search
CPC ............. H01L 27/1248; H01L 27/1259; H01L 27/1262
See application file for complete search history.

(56) References Cited

U.S. PATENT DOCUMENTS 10,048,535 B2 * 8/2018 Park .................. G02F 1/133617
2014/0340603 A1 11/2014 Hu et al.
(Continued)

FOREIGN PATENT DOCUMENTS

| CN | 203134796 U | 8/2013 |
| CN | 104166278 A | 11/2014 |

(Continued)

OTHER PUBLICATIONS

Jan. 30, 2018—(WO) International Search Report and Written Opinion Appn PCT/CN2017/109897 with English Translation.

*Primary Examiner* — Nicholas J Tobergte
(74) *Attorney, Agent, or Firm* — Banner & Witcoff, Ltd.

(57) ABSTRACT

An array substrate and a manufacturing method thereof, and a display device are provided. The array substrate includes a base substrate; a planarization layer, located on the base substrate; a first electrode layer, located on a side of the planarization layer away from the base substrate; and an insulating layer, located on a side of the planarization layer and the first electrode layer away from the base substrate, the insulating layer includes a plurality of first pores.

19 Claims, 4 Drawing Sheets

(51) Int. Cl.
*H01L 29/786* (2006.01)
*H01L 21/311* (2006.01)

(52) U.S. Cl.
CPC ...... *H01L 27/1259* (2013.01); *H01L 27/1274* (2013.01); *H01L 29/66765* (2013.01); *H01L 29/78678* (2013.01)

(56) References Cited

U.S. PATENT DOCUMENTS

| | | | |
|---|---|---|---|
| 2015/0070643 A1 | 3/2015 | Kim et al. | |
| 2016/0300898 A1* | 10/2016 | Kim | H01L 27/3262 |
| 2017/0162637 A1* | 6/2017 | Choi | G09G 3/20 |
| 2018/0267374 A1* | 9/2018 | Long | G02F 1/136227 |

FOREIGN PATENT DOCUMENTS

| | | |
|---|---|---|
| CN | 106449665 A | 2/2017 |
| CN | 206301792 U | 7/2017 |

\* cited by examiner

ARRAY SUBSTRATE AND MANUFACTURING METHOD THEREOF, AND DISPLAY DEVICE

CROSS REFERENCE

The application is a U.S. National Phase Entry of International Application No. PCT/CN2017/109897 filed on Nov. 8, 2017, designating the United States of America and claiming priority to Chinese Patent Application No. 201611094764.7 filed on Dec. 2, 2016. The present application claims priority to and the benefit of the above-identified applications and the above-identified applications are incorporated by reference herein in their entirety.

TECHNICAL FIELD

Embodiments of the present disclosure relate to an array substrate, a manufacturing method thereof, and a display device.

BACKGROUND

With the continuous development of display technology, liquid crystal display (LCD) has become a mainstream display device because of its advantages such as high response speed, high integration, and low power consumption. A liquid crystal display panel generally includes an array substrate and an opposed substrate which are cell assembled, and a liquid crystal layer disposed between the array substrate and the opposed substrate.

Generally, the array substrate includes thin film transistors arranged in an array, a planarization layer disposed on the thin film transistors, an electrode structure disposed on the planarization layer, and an insulating layer disposed on the planarization layer and the electrode structure. The planarization layer can be made of an organic film, and upon the planarization layer being an organic film, the organic film can be made flatter, lower in cost and simpler than a film made of an inorganic material.

SUMMARY

At least one embodiment of the present disclosure provides an array substrate and a manufacturing method thereof, and a display device.

At least one embodiment of the present disclosure provides an array substrate, which includes a base substrate, a planarization layer, a first electrode layer and an insulating layer. The planarization layer is disposed on the base substrate; the first electrode layer is disposed on a side of the planarization layer away from the base substrate; the insulating layer is disposed on a side of the planarization layer and the first electrode layer away from the base substrate, and the insulating layer includes a plurality of first pore structures.

For example, in the array substrate provided by an embodiment of the present disclosure, each of the first pore structures has a shape of ellipse.

For example, in the array substrate provided by an embodiment of the present disclosure, long axis directions of adjacent ones of the first pore structures are perpendicular to each other.

For example, in the array substrate provided by an embodiment of the present disclosure, each of the first pore structures has a shape of rectangle.

For example, in the array substrate provided by an embodiment of the present disclosure, long edge directions of adjacent ones of the first pore structures are perpendicular to each other.

For example, in the array substrate provided by an embodiment of the present disclosure, the array substrate further includes: a second electrode layer, disposed on a side of the insulating layer away from the first electrode layer, and including a plurality of openings, wherein an orthographic projection of the second electrode layer on the base substrate is at least partially overlapped with an orthographic projection of the first electrode layer on the base substrate, in an overlapped region of the orthographic projections of the first electrode layer on the base substrate and the second electrode layer on the base substrate, an orthographic projection of the first pore structures on the base substrate falls into an orthographic projection of the openings on the base substrate.

For example, in the array substrate provided by an embodiment of the present disclosure, the first electrode layer includes a plurality of second pore structures, in the overlapped region of the orthographic projections of the first electrode layer on the base substrate and the second electrode layer on the base substrate, an orthographic projection of the second pore structures on the base substrate is overlapped with the orthographic projection of the first pore structures on the base substrate.

For example, in the array substrate provided by an embodiment of the present disclosure, the plurality of first pore structures and the plurality of second pore structures are formed through a same patterning process.

For example, in the array substrate provided by an embodiment of the present disclosure, the array substrate further includes a thin film transistor located between the base substrate and the planarization layer.

For example, in the array substrate provided by an embodiment of the present disclosure, a thermal expansion coefficient of the planarization layer is different from that of the insulating layer.

For example, in the array substrate provided by an embodiment of the present disclosure, a material of the planarization layer includes an organic material, a material of the insulating layer includes an inorganic material.

At least one embodiment of the present disclosure provides a display device, which includes the array substrate according to any embodiment as mentioned above.

At least one embodiment of the present disclosure provides a manufacturing method of an array substrate, including: forming a planarization layer on a base substrate; forming a first electrode layer on a side of the planarization layer away from the base substrate; forming an insulating layer on a side of the planarization layer and the first electrode layer away from the base substrate; and patterning the insulating layer to form a plurality of first pore structures.

For example, in the manufacturing method of the array substrate provided by an embodiment of the present disclosure, the manufacturing method further includes: forming a second electrode layer on a side of the insulating layer away from the base substrate, an orthographic projection of the second electrode layer on the base substrate is at least partially overlapped with an orthographic projection of the first electrode layer on the base substrate, wherein the second electrode layer comprises a plurality of openings, in an overlapped region of the orthographic projections of the first electrode layer on the base substrate and the second electrode layer on the base substrate, an orthographic projection of the first pore structures on the base substrate falls into an orthographic projection of the openings on the base substrate.

For example, in the manufacturing method of the array substrate provided by an embodiment of the present disclosure, the manufacturing method further includes: patterning the insulating layer and the first electrode layer by one patterning process, so as to form a plurality of second pore structures in the first electrode layer having a same shape with the plurality of first pore structures.

For example, in the manufacturing method of the array substrate provided by an embodiment of the present disclosure, a thermal expansion coefficient of the planarization layer is different from that of the insulating layer.

For example, in the manufacturing method of the array substrate provided by an embodiment of the present disclosure, a material of the planarization layer comprises an organic material, a material of the insulating layer comprises an inorganic material.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a region but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "include," "including," "comprise," "comprising," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and upon the position of the object which is described is changed, the relative position relationship may be changed accordingly.

In the study, the inventor(s) of the present application has noticed that: in an array substrate, because a planarization layer (such as an organic film) and an insulating layer (such as an inorganic film) on the planarization layer have different expansion coefficients, the difference between deformation amounts of the two layers is relatively large upon the planarization layer and the insulating layer being in an environment of high temperature and low temperature. As a result, it is easy for the planarization layer and the insulating layer to break under the influence of an external force, thereby resulting in serious defects.

Figure 1A:
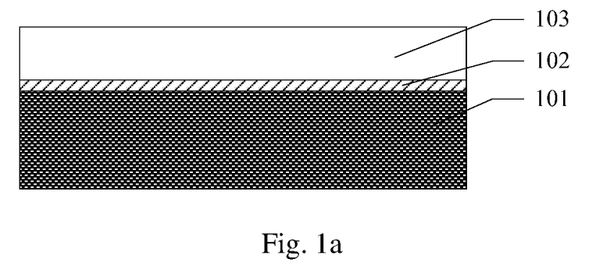
FIG. 1a is a schematic diagram of partial layers in an array substrate.

FIG. 1a is a schematic diagram of partial films in an array substrate. As illustrated by FIG. 1a, an array substrate includes a planarization layer 101, a first electrode layer 102 and an insulating layer 103. Because the planarization layer 101 and the insulating layer 103 have different expansion coefficients, for example, a material of the planarization layer 101 includes an organic material, such as polyimide and so on; and a material of the insulating layer 103 includes materials such as oxides, nitrides, or nitrogen oxides. That is, an organic film and an inorganic film have different expansion coefficients. In an environment of high temperature and low temperature, the difference between the deformation amounts of the planarization layer 101 and the insulating layer 103 is relatively large. For example, upon the temperature changing greatly, the deformation amount of the planarization layer 101 is larger than that of the insulating layer 103. Under the influence of the internal stress of the planarization layer 101, it is easy for the insulating layer 103 to break.

Figure 1B:
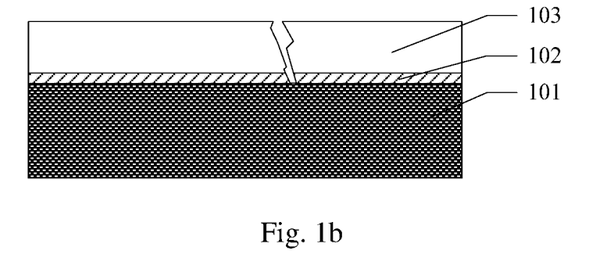
FIG. 1b is a schematic diagram of a breaking insulating layer in an array substrate.

FIG. 1b is a schematic diagram of a breaking insulating layer in an array substrate. As illustrated by FIG. 1b, under a combination action of an external slight force acting on the array substrate and an internal stress generated by the expansion of the planarization layer 101, it is easy for the insulating layer 103 to break, thereby resulting in serious defects.

Figure 1C:
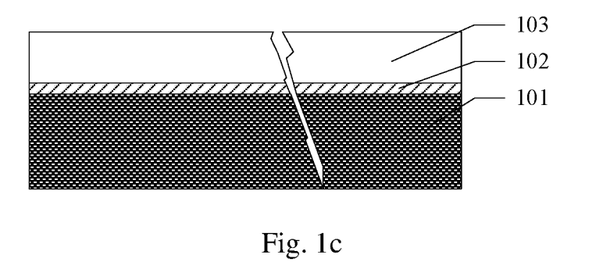
FIG. 1c is a schematic diagram of a breaking planarization layer in an array substrate.

FIG. 1c is a schematic diagram of a breaking planarization layer in an array substrate. As illustrated by FIG. 1c, upon the insulating layer 103 being broken under the internal stress of the planarization layer 101 located at the bottom of the insulating layer 103, on the one hand, because the stress will take a crack as a release hole, the crack will continue to extend; on the other hand, an external vibration and the bend of the glass base substrate can also cause the crack to further extend, and eventually resulting in a complete breakage of the planarization layer 101, resulting in serious defects, thereby affecting the display effect of a display region.

Embodiments of the present disclosure provide an array substrate, a manufacturing method thereof, and a display device. The array substrate includes a base substrate, a planarization layer, located on the base substrate, a first electrode layer, located on a side of the planarization layer away from the base substrate, and an insulating layer, located on a side of the planarization layer and the first electrode layer away from the base substrate. The insulating layer includes a plurality of first pore structures. Thus, by means of disposing the plurality of first pore structures in the insulating layer, the array substrate can reduce contact area between the insulating layer and the planarization layer and allows the planarization layer to release its internal stress at a position corresponding to the first pore structures, thereby decreasing the differences between deformation amounts of the insulating layer and the planarization layer, and then reducing the probability that the insulating layer breaks; in addition, the plurality of first pore structures can also buffer the breaking stress, and can be utilized to stop the breaking process upon the insulating layer being broken, so as to ultimately minimize the influence of the breaking, and improve the yield rate.

Hereafter, the array substrate and the manufacturing method thereof, and the display device provided by the embodiments of the present disclosure will be described with reference to the accompanying drawings.

Figure 2:
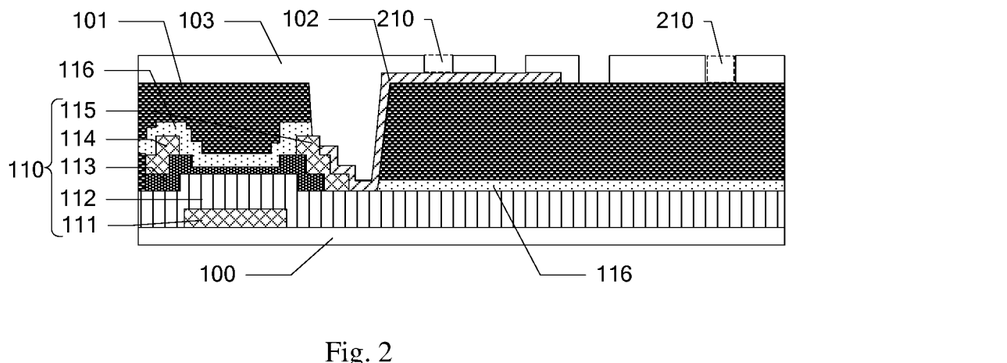
FIG. 2 is a sectional view of an array substrate provided by an embodiment of the present disclosure.

An embodiment of the present disclosure provides an array substrate, as illustrated by FIG. 2, the array substrate includes a base substrate 100, a planarization layer 101, a first electrode layer 102 and an insulating layer 103. The planarization layer 101 is disposed on the base substrate 100; the first electrode layer 102 is disposed on a side of the planarization layer 101 away from the base substrate 100; the insulating layer 103 is disposed on a side of the planarization layer 101 and the first electrode layer 102 away from the base substrate 100. And, as illustrated by FIG. 2, the insulating layer 103 includes a plurality of first pore structures 210. For example, the plurality of first pore structures 210 can be formed by performing a patterning process on the insulating layer 130.

Thus, in the array substrate provided by the present embodiment, the plurality of first pore structures 210 formed in the insulating layer 103 can entirely reduce contact area between the insulating layer 103 and the planarization layer 101, that is, a position of the insulating layer 103 where the first pore structures 210 are located is not contact with the planarization layer 101, the plurality of first pore structures 210 can expose a part of the planarization layer 101, or the planarization layer 101 and the first electrode layer 102, so that the stress generated by the planarization layer 101 upon the temperature being changed greatly can be released at the positions of the plurality of first pore structures 210, so as to reduce the difference in the deformation amounts of the planarization layer 101 and the insulating layer 103, thereby reducing the probability that the insulating layer breaks. In addition, the plurality of first pore structures 210 can also buffer the breaking stress. Upon the insulating layer 103 being partially broken, and the breaking crack extending to one or more of the plurality of first pore structures 210, the one or more first pore structures 210 can stop the crack from continuing to extend and spread. Thus, the plurality of first pore structures 210 can be utilized to stop the breaking process, thereby ultimately minimizing the impact of the breaking.

For example, the array substrate provided by an example of the present embodiment further includes a thin film transistor 110 located between the base substrate 100 and the planarization layer 101. As illustrated by FIG. 2, the thin film transistor 110 includes a gate electrode 111, a gate insulating layer 112, an active layer 113, a source electrode 114 and a drain electrode 115. For example, the present embodiment is described by taking a case where a bottom-gate thin film transistor as an example, embodiments of the present disclosure include but are not limited thereto, the thin film transistor can also be a top gate thin film transistor or a dual gate thin film transistor.

For example, the array substrate provided by an example of the present embodiment can further include a passivation layer 116 located on the source electrode 114 and the drain electrode 115 of the thin film transistor 110, the passivation layer 116 is utilized to prevent oxygen elements in the planarization layer 101 from corroding the source electrode 114 and the drain electrode 115.

For example, in the array substrate provided by an example of the present disclosure, thermal expansion coefficients of the planarization layer 101 and the insulating layer 103 are different. For example, a material of the planarization layer 101 includes an organic material, such as polyimide, the present embodiment is not limited thereto. For example, a material of the insulating layer 103 includes an inorganic material, such as oxides, nitrides, or nitrogen oxides, the present embodiment is not limited thereto. For example, in an environment of high temperature, the thermal expansion coefficient of the planarization layer 101 is larger than that of the insulating layer 103, the planarization layer 101 can produce a larger deformation amount than the insulating layer 103. Therefore, the internal stress generated in the planarization layer 101 can act on the insulating layer 103, and then it is easy for the insulating layer 103 to break. On the other hand, an external vibration and the bend of the array substrate can further cause the insulating layer 103 to break, and even the planarization layer 101 breaks completely. Therefore, by disposing the plurality of first pore structures 210 in the insulating layer 103, on the one hand, the difference between the deformation amounts of the planarization layer 101 and the insulating layer 103 can be reduced so as to reduce the probability that a film breaks; on the other hand, the breaking stress can be buffered, and the breaking process can be stopped at the time of breaking, so as to eventually minimize the influence of breaking and improve the yield rate.

Figure 3A:
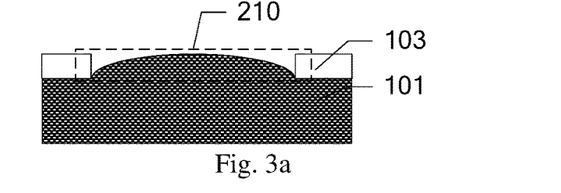
FIG. 3a is a schematic diagram of preventing a film from breaking in an array substrate provided by an embodiment of the present disclosure.

For example, FIG. 3a is a schematic diagram of preventing a film from breaking in an array substrate provided by the present embodiment. As illustrated by FIG. 3a, at a position where the insulating layer 103 is directly in contact with the planarization layer 101, because the plurality of first pore structures 210 located in the insulating layer 103 expose a part of the planarization layer 101, upon the temperature rising, the internal stress of the planarization layer 101 due to thermal expansion can be released at the position of the first pore structures 210 to avoid the influence of its internal stress on the insulating layer 103. And, the plurality of first pore structures 210 provide a larger deformation space for expansion of the planarization layer 101, thus reducing the probability of film breaking. That is, the planarization layer 101 can produce more thermal expansion deformation at the positions of the first pore structures 210, thereby releasing the internal stress, reducing the aggregation of the internal stress, so as to prevent the occurrence of fissile plastic deformation. It should be noted that, upon the temperature falling, the planarization layer contracts, likewise, the planarization layer can produce more cold contraction deformation at the positions of the first pore structures to reduce the aggregation of the internal stress, thereby preventing the occurrence of fissile plastic deformation. Certainly, the array substrate provided by embodiments of the present disclosure can also be used in a case where the deformation of the planarization layer and the insulating layer is inconsistent due to other environmental factors (for example, humidity, ph and so on), embodiments of the present disclosure are not limited thereto.

Figure 3B:
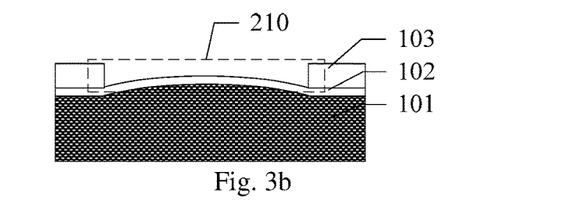
FIG. 3b is a schematic diagram of preventing a film from breaking in an array substrate provided by an embodiment of the present disclosure.

For example, FIG. 3b is another schematic diagram of preventing a film from breaking in an array substrate provided by the present embodiment. As illustrated by FIG. 3b, at a position where the first electrode layer 102 is disposed between the insulating layer 103 and the planarization layer 101, because the first electrode layer 102 has better ductility, upon the temperature rising, the internal stress of the planarization layer 101 due to thermal expansion can still be released at the position of the first electrode layer 102 to avoid the influence of its internal stress on the insulating layer 103. And the first electrode layer 102 can bulge upwards with the expansion of the planarization layer 101, in this case, the plurality of first pore structures 210 provide a larger deformation amount space for the expansion of the planarization layer 101, thereby reducing the probability of film breaking. It should be noted that, upon the temperature falling, the planarization layer contracts, likewise, the planarization layer can produce more cold contraction deformation at the positions of the first pore structures to reduce the aggregation of the internal stress, thereby preventing the occurrence of fissile plastic deformation. Certainly, the array substrate provided by embodiments of the present disclosure can also be used in a case where the deformation of the planarization layer and the insulating layer is inconsistent due to other environmental factors (for example, humidity, ph and so on), embodiments of the present disclosure are not limited thereto.

Figure 4:
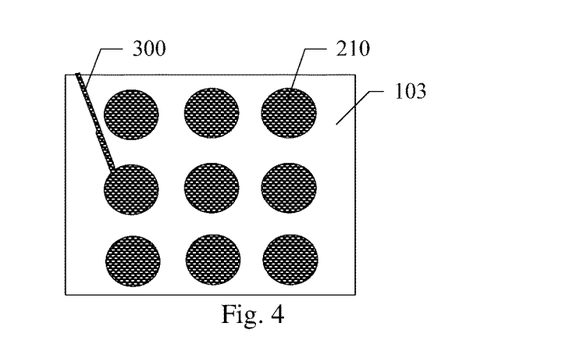
FIG. 4 is a schematic diagram of stopping a film from breaking in an array substrate provided by an embodiment of the present disclosure.

For example, FIG. 4 illustrates a schematic diagram of stopping a film from breaking in an array substrate provided by the present embodiment. As illustrated by FIG. 4, even upon the crack 300 being generated in the insulating layer 103, and the crack 300 extending to one or more of the plurality of first pore structures 210, the one or more first pore structures 210 can stop the crack 300 from continuing to extend, so that the crack 300 stops to extend and spread. Thus, the plurality of first pore structures 210 can be utilized to stop the breaking process, thereby ultimately minimizing the breaking influence.

For example, in the array substrate provided by an example of the present embodiment, the plurality of first pore structures can be formed by etching the insulating layer; the etching process can be plasma etching or wet etching and so on, embodiments of the present disclosure are not limited thereto.

For example in the array substrate provided by an example of the present embodiment, the base substrate can be made of one or more materials selected from the group consisting of glass, polyimide, polycarbonate, polyacrylate, polyetherimide, polyether sulfone, polyethylene terephthalate, and polyethylene naphthalate, embodiments of the present disclosure are not limited thereto.

For example, in the array substrate provided by an example of the present disclosure, the first electrode layer can be a transparent conductive layer. For example, a material selected for the transparent conductive layer includes a transparent conductive oxide. For example, the material can include a combination or at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO), embodiments of the present disclosure are not limited thereto. Certainly, the first electrode layer can also be a metal layer.

For example, in the array substrate provided by an example of the present embodiment, the first electrode layer can be a pixel electrode or an anode. Upon the first electrode layer being a pixel electrode, the array substrate provided by the present embodiment can be utilized in a liquid crystal display device; upon the first electrode layer being an anode, the array substrate provided by the present embodiment can be utilized in an organic light-emitting diode (OLED) display device. In addition, the first electrode layer can also be a common electrode, and embodiments of the present disclosure are not limited thereto.

For example, the active layer can include polysilicon. For example, polysilicon can be formed by crystallizing amorphous silicon. For example, amorphous silicon can be crystallized by using various suitable methods, which include rapid thermal annealing method, solid phase crystallization method, excimer laser annealing method, metal induced crystallization method, metal induced transverse crystallization method or sequential lateral crystallization method and so on. The present embodiment is not limited thereto, and the material of the active layer can be other materials.

For example, the material for forming the source electrode and the drain electrode can include at least one selected from the group consisting of Al, Pt, Pd, Ag, Mg, Au, Ni, Nd, Ir, Cr, Li, Ca, Mo, Ti, W, and Cu, and can be formed as a single layer or multiple layers, the present embodiment is not limited thereto.

For example, the material of the gate electrode can include a metal oxide material, for example, the metal oxide material can include one or a combination of ones selected from the group consisting of indium tin oxide, indium zinc oxide, zinc oxide, indium oxide, indium gallium oxide, and aluminum zinc oxide, the present embodiment is not limited thereto. The material of the gate electrode can also include one of a combination of ones selected from the group consisting of metal materials such as molybdenum, titanium, aluminum, copper and the like.

For example, the material of the gate insulating layer can be silicon nitride, silicon oxide or a combination of both, the present embodiment is not limited thereto.

Figure 5:
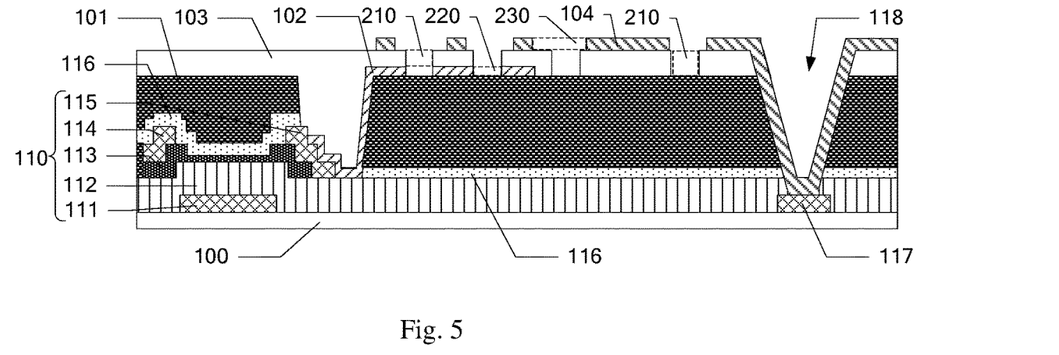
FIG. 5 is a sectional view of an array substrate provided by an embodiment of the present disclosure.

An embodiment of the present disclosure provides another array substrate, as illustrated by FIG. 5, the array substrate further includes a second electrode layer 104, the second electrode layer 104 is disposed on a side of the insulating layer 103 away from the first electrode layer 102, and includes a plurality of openings 230. As illustrated by FIG. 5, the openings 230 are located at the position of the box of dotted lines in the same layer as the second electrode layer 104. For example, an orthographic projection of the second electrode layer 104 on the base substrate 100 is at least partially overlapped with an orthographic projection of the first electrode layer 102 on the base substrate 100, in an overlapped region of the orthographic projections of the first electrode layer 102 on the base substrate 100 and the second electrode layer 104 on the base substrate 100, an orthographic projection of each of the first pore structures 210 on the base substrate 100 falls into an orthographic projection of each of the openings 230 on the base substrate 100. For example, a minimum size of a cross section of each opening 230 parallel to a plane of the base substrate 100 is greater than a maximum size of a cross section of each of the first pore structures 210 parallel to the plane of the base substrate 100, the present embodiment is not limited thereto. The present embodiment can further include a case that the minimum size of the cross section of each opening 230 parallel to the plane of the base substrate 100 is equal to the maximum size of the cross section of each first pore structure 210 parallel to the plane of the base substrate 100. In the overlapped region of the orthographic projections of the first electrode layer 102 on the base substrate 100 and the second electrode layer 104 on the base substrate 100, the orthographic projection of each of the first pore structures 210 on the base substrate 100 falls into the orthographic projection of each of the openings 230 on the base substrate 100, upon forming the second electrode layer 104, the second electrode layer 104 and the first electrode layer 102 can be prevented from being electrically connected, and the insulating layer 103 between the second electrode layer 104 and the first electrode layer 102 can ensure a good insulation effect. It should be noted that, upon the first electrode layer and/or the second electrode layer being a slit electrode layer, the abovementioned overlapped region of the orthographic projections of the first electrode layer on the base substrate and the second electrode layer on the base substrate is a region surrounded by the first electrode layer and the second electrode layer, which includes slits of the first electrode layer and/or the second electrode layer.

For example, upon the array substrate provided by the present embodiment being used for a liquid crystal display device, the second electrode layer can be a slit electrode, thus, the second electrode layer can generate a lateral electric field with the first electrode layer to drive liquid crystal molecules to deflect.

It should be noted that, the abovementioned first pore structures are different from a via hole formed in the insulating layer. For example, as illustrated by FIG. 5, the array substrate further includes a common electrode line 117 disposed on the base substrate 100. In order to connect the second electrode layer 104 on the insulating layer 103 with the common electrode line 117, a via hole 118 is disposed in the insulating layer 103 to electrically connect the second electrode layer 104 with the common electrode line 117. However, the plurality of first pore structures 210 in the present embodiment are not used for electrically connection, that is, each of the first pore structures 210 does not include a conductive layer or a part of a conductive layer. In addition, the plurality of first pore structures 210 in the present embodiment can be disposed not only in a region where the planarization layer 101 is directly contacted with the insulating layer 103, but also in a region where the first electrode layer 102 exists between the planarization layer 101 and the insulating layer 103.

For example, the second electrode layer 104 can also be a transparent conductive layer, for example, the selected material includes a metal oxide material, for example, the metal oxide material can include one or a combination of ones selected from the group consisting of indium tin oxide, indium zinc oxide, zinc oxide, indium oxide, indium gallium oxide, and aluminum zinc oxide, the present embodiment is not limited thereto. Certainly, the first electrode layer can also be a metal layer.

For example, in the array substrate provided in an example of the present embodiment, the first electrode layer 102 includes a plurality of second pore structures 220, and in the overlapped region of the orthographic projections of the first electrode layer 102 on the base substrate 100 and the second electrode layer 104 on the base substrate 100, an orthographic projection of the plurality of second pore structures 220 on the base substrate 100 is overlapped with the orthographic projection of the plurality of first pore structures 210 on the base substrate 100. As illustrated by FIG. 5, the second pore structures 220 are located at the position of the box of dotted lines in the same layer as the first electrode layer 102. Because thermal expansion coefficients of the planarization layer 101 and the first electrode layer 102 are different, the plurality of second pore structures 220 disposed in the first electrode layer 102 can entirely reduce contact area between the planarization layer 101 and the first electrode layer 102, thereby decreasing the difference of deformation amounts of the planarization layer 101 and the first electrode layer 102, and then reducing the probability that the first electrode layer breaks; in addition, the plurality of second pore structures 220 can also buffer the breaking stress, and can be utilized to stop the breaking process upon the first electrode layer being broken, so as to ultimately minimize the influence of the breaking. On the other hand, the plurality of second pore structures 220 can also provide a larger deformation amount space for expansion deformation or contraction deformation of the planarization layer. It should be noted that, a case that the orthographic projection of the plurality of second pore structures on the base substrate is overlapped with the orthographic projection of the first pore structures on the base substrate as mentioned above refers that a shape and a size of the cross section of each second pore structure parallel to a plane of the base substrate is equal to a shape and a size of the cross section of each first pore structure parallel to a plane of the base substrate, embodiments of the present disclosure include but are not limited thereto. For example, the orthographic projection of the plurality of second pore structures can also be incompletely overlapped with the orthographic projection of the plurality of first pore structures on the base substrate.

For example, in the array substrate provided by an example of the present embodiment, the plurality of second pore structures 220 can be formed by an etching process, and the etching process can include plasma etching or wet etching and so on, embodiments of the present disclosure are not limited thereto.

For example, in the array substrate provided by an example of the present disclosure, the first pore structures 210 and the second pore structures 220 can be formed through the same patterning process, that is, each of the first pore structures 210 and each of the second pore structures 220 have the same shape and size. In other words, in the overlapped region of the orthographic projections of the first electrode layer 102 on the base substrate 100 and the second electrode layer 104 on the base substrate 100, an orthographic projection of each of the second pore structures 220 on the base substrate 100 is completely overlapped with an orthographic projection of each of the first pore structures 210 on the base substrate 100. The first pore structures 210 and the second pore structures 220 can be formed by using the same patterning process, which can reduce patterning steps and save costs. Certainly, the first pore structures 210 and the second pore structures 220 can also be formed through two times of patterning processes. It should be noted that, upon the plurality of first pore structures and the plurality of second pore structures being simultaneously etched by using one etching process, due to the consumption of the etching gas or etching solution during the etching process, the etching rate may decrease as the etching proceeds, resulting in the size of each of the second pore structures being slightly smaller than that of the first pore structures. However, embodiments according to the present disclosure are not limited thereto, the size of each of the second pore structures can also be slightly larger than that of the first pore structures.

Figure 6:
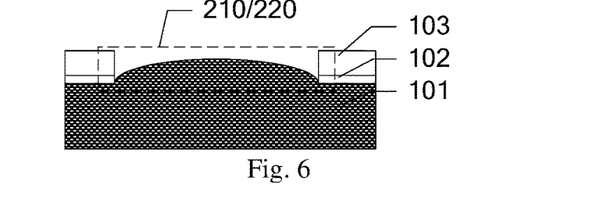
FIG. 6 is a schematic diagram of preventing a film from breaking in an array substrate provided by an embodiment of the present disclosure.

For example, FIG. 6 is a schematic diagram of preventing a film from breaking in an array substrate provided by the present embodiment. As illustrated by FIG. 6, at a position of the first electrode layer 102 exists between the insulating layer 103 and the planarization layer 101, because the first electrode layer 102 is provided with the plurality of second pore structures 220, the plurality of second pore structures 220 and the plurality of first pore structures 210 can expose a part of the planarization layer 101. Upon the temperature rising, the internal stress of the planarization layer 101 due to thermal expansion can be released at the position of the first pore structures 210 and the second pore structures 220 to avoid the influence of its internal stress on the insulating layer 103. And, the plurality of first pore structures 210 provide a larger deformation space for expansion of the planarization layer 101, thus reducing the probability of film breaking. That is, the planarization layer 101 can produce more thermal expansion deformation at the positions of the first pore structures 210, thereby releasing the internal stress, reducing the aggregation of the internal stress, so as to prevent the occurrence of fissile plastic deformation. It should be noted that, upon the temperature falling, the planarization layer contracts, likewise, the planarization layer can produce more cold contraction deformation at the positions of the first pore structures to reduce the aggregation of the internal stress, thereby preventing the occurrence of fissile plastic deformation. Certainly, the array substrate provided by embodiments of the present disclosure can also be used in a case where the deformations of the planarization layer and the insulating layer are inconsistent due to other environmental factors (for example, humidity, ph and so on), embodiments of the present disclosure are not limited thereto.

Figure 7:
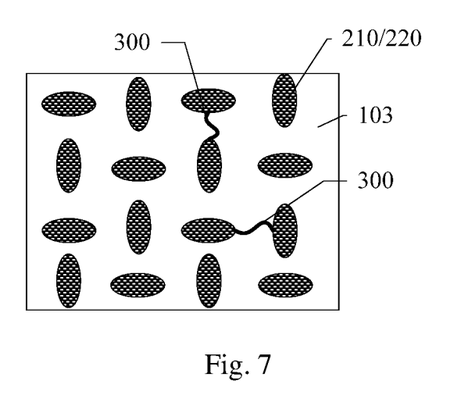
FIG. 7 is a schematic diagram of stopping a film from breaking in an array substrate provided by an embodiment of the present disclosure.

For example, in the array substrate provided by an example of the present disclosure, as illustrated by FIG. 7, each of the plurality of first pore structures 210 and each of the plurality of second pore structures 220 have a shape of ellipse. Furthermore, the shape of the plurality of first pore structures and the plurality of second pore structures can also be a pattern having a long axis or a long edge, such as a rectangle, a long strip, or the like. It should be noted that, FIG. 7 only illustrates the insulating layer 103 and a shape and an arrangement of the pore structures left in the insulating layer after etching. It should be noted that, embodiments of the present disclosure include but are not limited thereto, the shape of the plurality of first pore structures and the plurality of second pore structures can also be square, circular or the like.

For example, as illustrated by FIG. 7, long axis directions or long edge directions of adjacent ones of the first pore structures 210 or adjacent ones of the second pore structures 220 are perpendicular to each other. That is, upon each of the first pore structures 210 having a shape of ellipse, the long axis directions of adjacent ones of the first pore structures 210 or adjacent ones of the second pore structures 220 are perpendicular to each other; upon each of the first pore structures 210 having a shape of rectangular, the long edge directions of adjacent ones of the first pore structures 210 or adjacent ones of the second pore structures 220 are perpendicular to each other. According to the principle of material structure mechanics, under the internal and external stress, it is easy for the long axis directions of a hollow elliptical first pore structure 210 or second pore structure 220 to break first, and a crack extends along the long axis direction thereof. Upon the crack reaching short axis of the elliptical first pore structure 210 or the second pore structure 220, the breaking will stop due to the buffer effect in the short axis direction. As a whole, the crack between the adjacent ones of the first pore structures 210 or the adjacent ones of the second pore structures 220 is very small, and no continuous breaking will occur under the buffering effect of the short axis, so as to achieve a purpose of preventing the breaking. On the other hand, the etching process to the insulating layer 103 or the first electrode layer 102 reduces the contact area between the insulating layer 103 or the first electrode layer 102 and the planarization layer 101 as a whole, that is, reducing the relative difference in deformation amounts of the two layers, therefore, the insulating layer breaks not easily.

Figure 8:
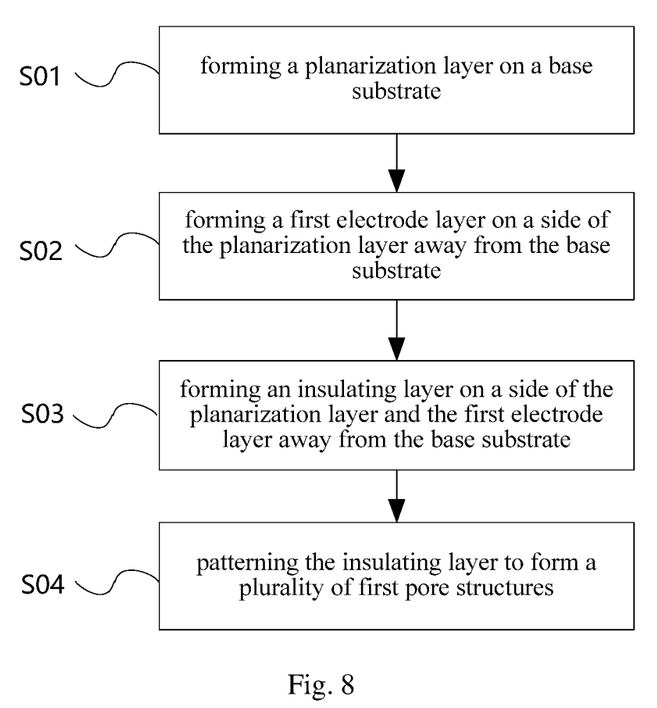
FIG. 8 is a flow chart of a manufacturing method of an array substrate provided by an embodiment of the present disclosure.

An embodiment of the present disclosure further provides a manufacturing method of an array substrate, specific steps are illustrated in FIG. 8, which include:

S01: forming a planarization layer on a base substrate.

S02: forming a first electrode layer on a side of the planarization layer away from the base substrate.

S03: forming an insulating layer on a side of the planarization layer and the first electrode layer away from the base substrate.

S04: patterning the insulating layer to form a plurality of first pore structures.

Thus, in the manufacturing method of the array substrate provided by the present disclosure, patterning the insulating layer and forming the plurality of first pore structures can entirely reduce a contact area between the insulating layer and the planarization layer, and expose a part of the planarization layer or the planarization layer and the first electrode layer, so that the stress of the planarization layer can be released at the position of the plurality of the first pore structures upon the temperature changing greatly, thereby reducing the difference in the deformation amounts of the planarization layer and the insulating layer, and reducing the probability that the insulating layer breaks. In addition, patterning the insulating layer and forming the plurality of first pore structures can also buffer the breaking stress, upon the insulating layer being partially broken, and the breaking crack extending to one or more of the plurality of first pore structures, the one or more first pore structures can stop the crack from continuing to extend and spread. Thus, the plurality of first pore structures can be utilized to stop the breaking process, thereby ultimately minimizing the influence of the breaking.

For example, in the manufacturing method of the array substrate provided by the present disclosure, thermal expansion coefficients of the planarization layer and the insulating layer are different. For example, a material of the planarization layer includes an organic material, such as polyimide, the present embodiment is not limited thereto. For example, a material of the insulating layer includes an inorganic material, such as oxides, nitrides, or nitrogen oxides, the present embodiment is not limited thereto. For example, in an environment of high temperature, the thermal expansion coefficient of the planarization layer is larger than that of the insulating layer, the planarization layer can produce a larger deformation amount than the insulating layer. Therefore, the internal stress generated in the planarization layer may act on the insulating layer, and then it is easy for the insulating layer to break. An external vibration and the bend of the array substrate can further cause the insulating layer to break, and even the planarization layer breaks completely.

The step of patterning the insulating layer to form the plurality of first pore structures, on the one hand, can overall reduce the contact area between the insulating layer and the planarization layer, so that the difference of deformation amounts of the insulating layer and the planarization layer can be reduced, so as to reduce the probability of film breaking; on the other hand, the plurality of first pore structures can buffer the breaking stress, so that the planarization layer cannot produce too much internal stress due to the deformation upon the temperature changing greatly, the plurality of first pore structures can be utilized to stop the breaking process, so as to eventually minimize the impact of breaking and improve the yield rate.

For example, an etching process can be adopted for patterning the insulating layer to form the plurality of first pore structures, for example, the etching process includes plasma etching or wet etching and so on, embodiments of the present disclosure are not limited thereto.

For example, the manufacturing method of the array substrate provided by the present disclosure, further includes: forming a second electrode layer on a side of the insulating layer away from the base substrate. The second electrode layer includes a plurality of openings, an orthographic projection of the second electrode layer on the base substrate is at least partially overlapped with an orthographic projection of the first electrode layer on the base substrate, in an overlapped region of the orthographic projections of the first electrode layer on the base substrate and the second electrode layer on the base substrate, an orthographic projection of each of the first pore structures on the base substrate falls into an orthographic projection of each of the openings on the base substrate. For example, a minimum size of a cross section of each opening parallel to a plane of the base substrate is greater than a maximum size of a cross section of each first pore structure parallel to the plane of the base substrate, the present embodiment is not limited thereto. The present embodiment can further include a case that the minimum size of the cross section of each opening parallel to the plane of the base substrate is equal to the maximum size of the cross section of each first pore structure parallel to the plane of the base substrate. The orthographic projection of each of the first pore structures on the base substrate falls into an orthographic projection of each of the openings on the base substrate, upon forming the second electrode layer, the second electrode layer and the first electrode can be prevented from being electrically connected, and the insulating layer between the second electrode layer and the first electrode layer can ensure a good insulation effect.

For example, the manufacturing method of the array substrate provided by an example of the present embodiment, further includes: patterning the insulating layer and the first electrode layer by one patterning process, so as to form a second pore structure in the first electrode layer with a same shape as the first pore structure. Using the one-time patterning process to pattern the insulating layer and the first electrode layer can reduce patterning steps and save costs. The present embodiment is not limited thereto, the first pore structures and the second pore structures can also formed through two times of patterning processes.

Because thermal expansion coefficients of the planarization layer and the first electrode layer are different, for example, the first electrode layer can be a transparent conductive layer. For example, a material selected for the transparent conductive layer includes a transparent conductive oxide. For example, the material can include a combination of ones or at least one selected from the group consisting of indium tin oxide, indium zinc oxide, zinc oxide, indium oxide, indium gallium oxide, and aluminum zinc oxide. The plurality of second pore structures disposed in the first electrode layer can entirely reduce contact area between the planarization layer and the first electrode layer, thereby decreasing a difference in the deformation amounts of the planarization layer and the first electrode layer, and then reducing the probability that the first electrode layer breaks; in addition, the plurality of second pore structures can also buffer the breaking stress, and can be utilized to stop the breaking process upon the first electrode layer being broken, so as to ultimately minimize the impact of the breaking. On the other hand, the plurality of second pore structures can also provide a larger deformation space for expansion deformation or contraction deformation of the planarization layer. It should be noted that, an abovementioned case that the first pore structures have the same shape as the second pore structures refers that in the overlapped region of the orthographic projections of the first electrode layer and the second electrode layer on the base substrate, a shape and a size of the cross section of each of the second pore structures parallel to a plane of the base substrate is equal to a shape and a size of the cross section of each of the first pore structures parallel to a plane of the base substrate, embodiments of the present disclosure include but are not limited thereto. For example, the orthographic projection of the plurality of second pore structures can also be incompletely overlapped with the orthographic projection of the plurality of first pore structures on the substrate.

Figure 9:
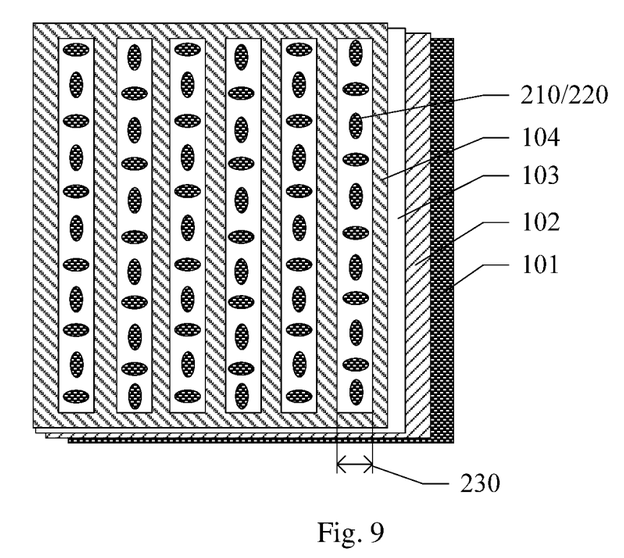
FIG. 9 is a structural view of an array substrate provided by an embodiment of the present disclosure.

FIG. 9 is a three-dimensional film diagram of an array substrate produced by a manufacturing method of an array substrate provided by an example of the present embodiment. As illustrated by FIG. 9, an insulating layer 103 can be patterned to form a plurality of first pore structures 210 in a region of a plurality of openings 230 in the second electrode layer 104; a first electrode layer 102 can be patterned to forming a plurality of second pore structures 220 after etching the insulating layer 103. Certainly, the first pore structures 210 and the second pore structures 220 can be formed through the same patterning process, embodiments of the present disclosure are not limited thereto. A planarization layer 101 can be exposed after the insulating layer 103 and the first electrode layer 102 being etched, the exposed planarization layer 101 can be directly covered by an alignment film during the subsequent manufacture of the array substrate. It should be noted that, some layers in the array substrate illustrated by FIG. 9 include the planarization layer 101, the first electrode layer 102, the insulating layer 103 and the second electrode layer 104. In order to describe clearly, each layer in the figures is staggered with each other. In fact, the positional relationship of each layer is illustrated in FIG. 2 or FIG. 5. After etching the insulating layer 103 and the first electrode layer 102 to form the first pore structures 210 and the second pore structures 220, the first pore structures 210 and the second pore structures 220 provide a larger deformation space for expansion of the planarization layer 101 in a case of high temperature, that is, the planarization layer 101 can produce more thermal expansion deformation at the position of the first pore structures 210 and the second pore structures 220, thereby releasing the internal stress, reducing the aggregation of the internal stress, so as to prevent the occurrence of fissile plastic deformation.

For example, in the manufacturing method of the array substrate provided by an example of the present embodiment, each of the first pore structures and each of the second pore structures have a shape of ellipse, embodiments of the present disclosure are not limited thereto, the shape of the plurality of first pore structures and the plurality of second pore structures can also be a pattern having a long axis or a long side, such as a rectangle, a long strip, or the like.

For example, in the manufacturing method of the array substrate provided by an example of the present embodiment, long axis directions or long edge directions of adjacent ones of the first pore structures or adjacent ones of the second pore structures are perpendicular to each other. That is, upon each of the first pore structures having a shape of ellipse, the long axis directions of adjacent ones of the first pore structures or adjacent ones of the second pore structures are perpendicular to each other; upon each of the first pore structures having a shape of rectangular, the long edge directions of adjacent ones of the first pore structures or adjacent ones of the second pore structures are perpendicular to each other. The selection of the shapes formed by the patterning of the first pore structures and the second pore structures and the arrangement state thereof can effectively stop the film from breaking.

For example, the manufacturing method of the array substrate provided by the present embodiment further includes forming a thin film transistor between the base substrate and the planarization layer. For example, forming a gate electrode on the base substrate, forming a gate insulating layer on the gate electrode to insulate a subsequent formed layer. Forming an active layer on the gate insulating layer, for example, the active layer includes a channel region, a source contact region electrically connected to a source electrode, and a contact region electrically connected to a drain electrode; here, the source contact region and the drain contact region of the active layer are respectively electrically connected to the subsequently formed the source electrode and the drain electrode. The source electrode and the drain electrode are formed on the active layer. For example, the present embodiment takes an example of a bottom-gate thin film transistor, but is not limited thereto, the thin film transistor can also be a top gate thin film transistor or dual gate thin film transistor.

An embodiment of the present disclosure further provides a display device, the display device includes the array substrate according to any of the above embodiments. The display device can effectively reduce the probability of layers breaking, ultimately minimize the impact of the breaking, and improve the yield rate.

For example, the display device includes a liquid crystal display device, an organic light emitting diode display device and so on, the present embodiment is not limited thereto.

For example, the display device can be widely applied to various display terminals, including but not limited to mobile phones, notebooks, tablet computers, advertisement display cards, digital photo frames, POS machines, game terminals or the like.

The following points should to be explained:

(1) Unless otherwise defined, in the embodiments and accompanying drawings in the present disclosure, the same reference numeral represents the same meaning.

(2) The accompanying drawings involve only the structure(s) in connection with the embodiment(s) of the present disclosure, and other structure(s) can be referred to common design(s).

(3) For the purpose of clarity, in accompanying drawings for illustrating the embodiment(s) of the present disclosure, layer(s) or region(s) may be enlarged. However, it should understood that, in the case in which a component or element such as a layer, film, region, substrate or the like is referred to be "on" or "under" another component or element, it may be directly on or under the another component or element or a component or element is interposed therebetween.

The foregoing is only the embodiments of the present disclosure and not intended to limit the scope of protection of the present disclosure, alternations or replacements which can be easily envisaged by any skilled person being familiar with the present technical field shall fall into the protection scope of the present disclosure. Thus, the protection scope of the present disclosure should be based on the protection scope of the claims.

What is claimed is:

1. An array substrate, comprising:
   a base substrate;
   a planarization layer, located on the base substrate;
   a first electrode layer, located on a surface of the planarization layer away from the base substrate; and
   an insulating layer, located on a side of the planarization layer and the first electrode layer away from the base substrate,
   wherein the insulating layer comprises a plurality of first pore structures, the planarization layer is in partial contact with the insulating layer, and at least one of the plurality of first pore structures is located in a contact region of the planarization layer and the insulating layer.

2. The array substrate according to claim 1, wherein each of the first pore structures has a shape of ellipse.

3. The array substrate according to claim 2, wherein long axis directions of adjacent ones of the first pore structures are perpendicular to each other.

4. The array substrate according to claim 1, wherein each of the first pore structures has a shape of rectangle.

5. The array substrate according to claim 4, wherein long edge directions of adjacent ones of the first pore structures are perpendicular to each other.

6. The array substrate according to claim 1, further comprising:
   a second electrode layer, located on a side of the insulating layer away from the first electrode layer, and comprising a plurality of openings,
   wherein an orthographic projection of the second electrode layer on the base substrate is at least partially overlapped with an orthographic projection of the first electrode layer on the base substrate, in an overlapped region of the orthographic projections of the first electrode layer on the base substrate and the second electrode layer on the base substrate, an orthographic projection of the first pore structures on the base substrate falls into an orthographic projection of the openings on the base substrate.

7. The array substrate according to claim 6, wherein the first electrode layer comprises a plurality of second pore structures, in the overlapped region of the orthographic projections of the first electrode layer on the base substrate and the second electrode layer on the base substrate, an orthographic projection of the second pore structures on the base substrate is overlapped with the orthographic projection of the first pore structures on the base substrate.

8. The array substrate according to claim 7, wherein the plurality of first pore structures and the plurality of second pore structures are formed through a same patterning process.

9. The array substrate according to claim 1, further comprising a thin film transistor located between the base substrate and the planarization layer.

10. The array substrate according to claim 1, wherein a thermal expansion coefficient of the planarization layer is different from that of the insulating layer.

11. The array substrate according to claim 1, wherein a material of the planarization layer comprises an organic material, and a material of the insulating layer comprises an inorganic material.

12. A display device, comprising the array substrate according to claim 1.

13. A manufacturing method of an array substrate, comprising:
    forming a planarization layer on a base substrate;
    forming a first electrode layer on a surface of the planarization layer away from the base substrate;
    forming an insulating layer on a side of the planarization layer and the first electrode layer away from the base substrate; and
    patterning the insulating layer to form a plurality of first pore structures,
    wherein the planarization layer is in partial contact with the insulating layer, and at least one of the plurality of first pore structures is located in a contact region of the planarization layer and the insulating layer.

14. The manufacturing method according to claim 13, further comprising:
    forming a second electrode layer on a side of the insulating layer away from the base substrate, wherein an orthographic projection of the second electrode layer on the base substrate is at least partially overlapped with an orthographic projection of the first electrode layer on the base substrate,
    wherein the second electrode layer comprises a plurality of openings, in an overlapped region of the orthographic projections of the first electrode layer on the base substrate and the second electrode layer on the base substrate, an orthographic projection of the first pore structures on the base substrate falls into an orthographic projection of the openings on the base substrate.

15. The manufacturing method according to claim 13, further comprising:
    patterning the insulating layer and the first electrode layer by one patterning process, so as to form a plurality of second pore structures in the first electrode layer having a same shape as the plurality of first pore structures.

16. The manufacturing method according to claim 13, wherein a thermal expansion coefficient of the planarization layer is different from that of the insulating layer.

17. The manufacturing method according to claim 13, wherein a material of the planarization layer comprises an organic material, and a material of the insulating layer comprises an inorganic material.

18. The array substrate according to claim 2, further comprising:
    a second electrode layer, located on a side of the insulating layer away from the first electrode layer, and comprising a plurality of openings,
    wherein an orthographic projection of the second electrode layer on the base substrate is at least partially overlapped with an orthographic projection of the first electrode layer on the base substrate, in an overlapped region of the orthographic projections of the first electrode layer on the base substrate and the second electrode layer on the base substrate, an orthographic projection of the first pore structures on the base substrate falls into an orthographic projection of the openings on the base substrate.

19. The array substrate according to claim 2, wherein a thermal expansion coefficient of the planarization layer is different from that of the insulating layer.

* * * * *